United States Patent
Subramanian et al.

(10) Patent No.: US 6,322,009 B1
(45) Date of Patent: Nov. 27, 2001

(54) COMMON NOZZLE FOR RESIST DEVELOPMENT

(75) Inventors: Ramkumar Subramanian; Khoi A. Phan, both of San Jose; Bharath Rangarajan, Santa Clara; Bhanwar Singh, Morgan Hill, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/429,992

(22) Filed: Oct. 29, 1999

(51) Int. Cl.$^7$ ............... B05B 9/00; B05B 1/14; A62C 2/08
(52) U.S. Cl. ............ 239/548; 239/124; 239/125; 239/551
(58) Field of Search .................. 239/124, 125, 239/548, 549, 550, 551, 562, 566; 430/322, 325; 118/302, 320, 52, 54, 319

(56) References Cited

U.S. PATENT DOCUMENTS

| | | | |
|---|---|---|---|
| 3,071,540 | * 1/1963 | McMahon et al. | 239/548 |
| 5,089,305 | 2/1992 | Ushijima et al. | 427/422 |
| 5,275,658 | 1/1994 | Kimura | 118/302 |
| 5,474,877 | 12/1995 | Suzuki | 430/325 |
| 5,482,745 | * 1/1996 | Cuellar et al. | 427/421 |
| 5,555,234 | 9/1996 | Sugimoto | 354/317 |
| 5,658,615 | * 8/1997 | Hasebe et al. | 427/240 |
| 5,678,116 | * 10/1997 | Sugimoto et al. | 396/611 |
| 5,695,817 | * 12/1997 | Tateyama et al. | 427/240 |
| 5,772,764 | * 6/1998 | Akimoto | 239/549 |
| 5,826,130 | 10/1998 | Tanaka et al. | 396/611 |
| 5,885,755 | 3/1999 | Nakagawa et al. | 430/325 |
| 5,904,301 | * 5/1999 | Kajiyama et al. | 239/549 |
| 5,975,097 | * 11/1999 | Yonemizu et al. | 134/95.2 |

* cited by examiner

Primary Examiner—David A. Scherbel
Assistant Examiner—Davis Hwu
(74) Attorney, Agent, or Firm—Amin & Turocy, LLP

(57) ABSTRACT

A combination nozzle for applying a developer material and a washing solution material at different time intervals to a photoresist material layer disposed on a wafer is provided. The combination nozzle includes a number of developer nozzle tips connected to a developer supply line and a number of washing solution nozzle tips connected to a washing solution supply line. The developer supply line and the washing solution supply line ensure that the developer material and the washing solution material are always substantially isolated from one another. Furthermore, the developer nozzle tips and the washing solution nozzle tips are arranged so that developer material and washing solution material do not come into contact with one another. The volume of the material and the volume flow of the material can be controlled by electronically controlled valves.

17 Claims, 7 Drawing Sheets

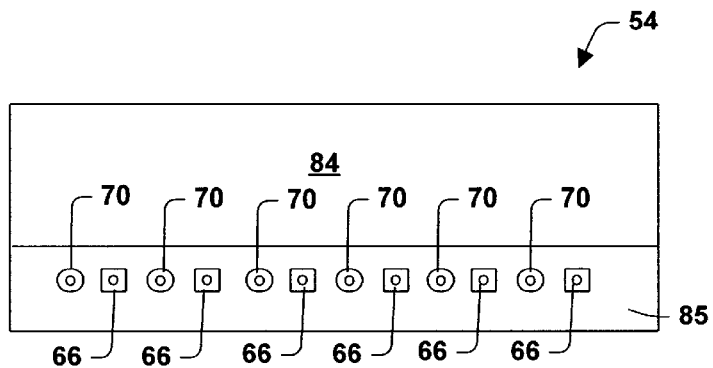
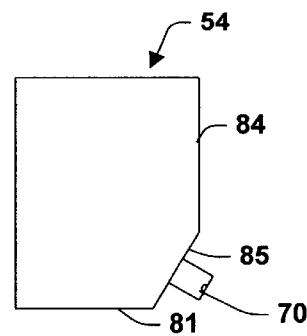
Fig. 3a                    Fig. 3b
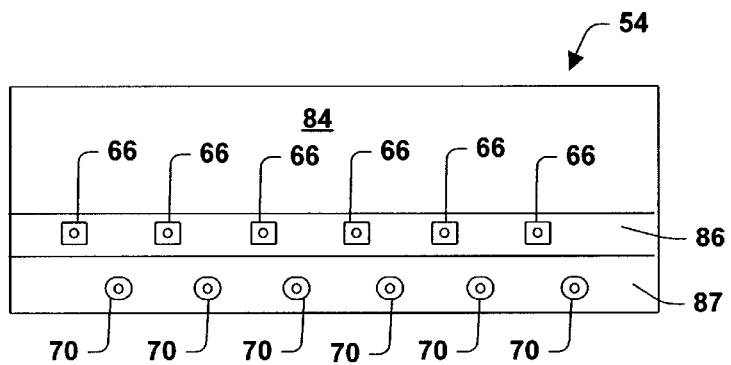
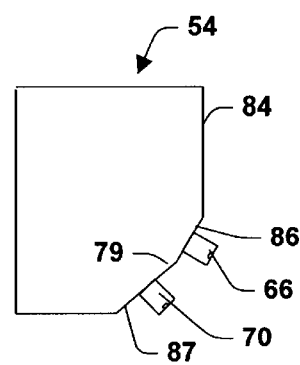
Fig. 4a                    Fig. 4b
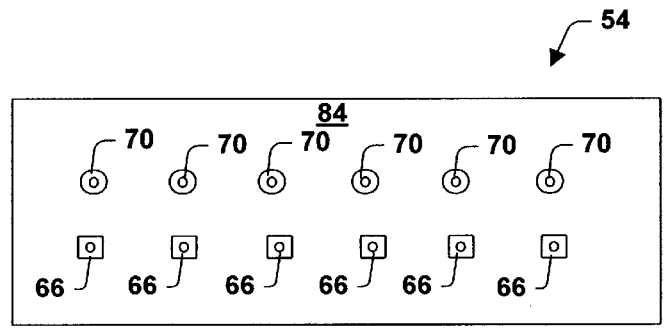
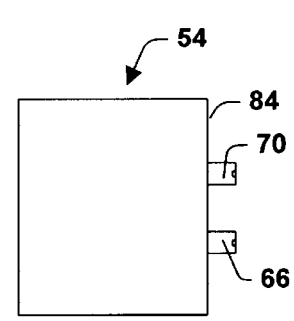
Fig. 5a                    Fig. 5b

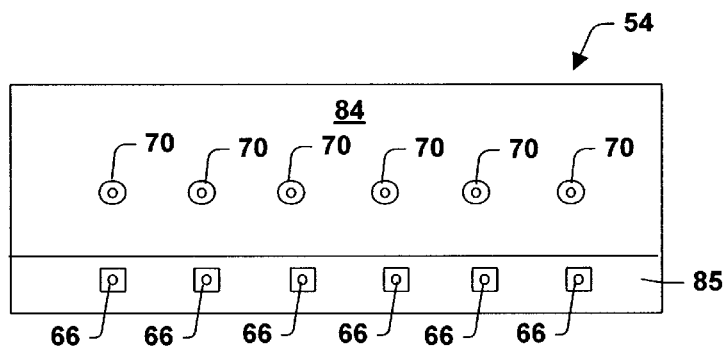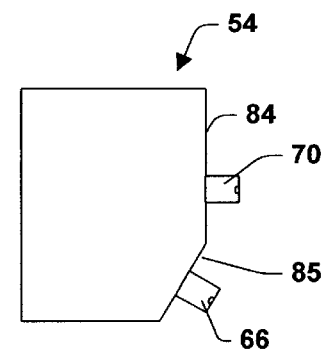
Fig. 6a  Fig. 6b
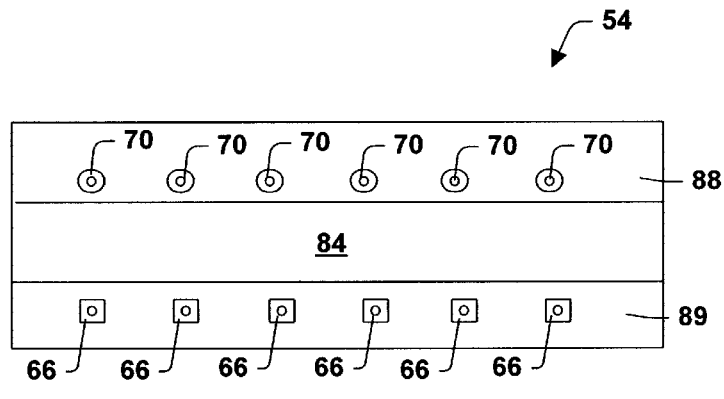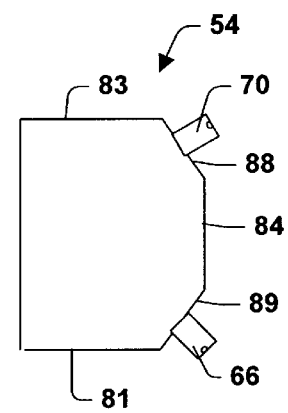
Fig. 7a  Fig. 7b

COMMON NOZZLE FOR RESIST DEVELOPMENT

TECHNICAL FIELD

The present invention generally relates to semiconductor processing, and in particular to a common nozzle for applying a developer material and a washing solution material at different time intervals to a photoresist material layer disposed on a semiconductor wafer.

BACKGROUND OF THE INVENTION

In the semiconductor industry, there is a continuing trend toward higher device densities. To achieve these high densities there has been and continues to be efforts toward scaling down device dimensions (e.g., at submicron levels) on semiconductor wafers. In order to accomplish such high device packing density, smaller and smaller features sizes are required. This may include the width and spacing of interconnecting lines, spacing and diameter of contact holes, and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon structure is coated uniformly with a radiation-sensitive film, the resist, and an exposing source (such as optical light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Due to the extremely fine patterns which are exposed on the photoresist material, thickness uniformity of the photoresist material is a significant factor in achieving desired critical dimensions. The photoresist material should be applied such that a uniform thickness is maintained in order to ensure uniformity and quality of the photoresist material layer. The photoresist material layer thickness typically is in the range of 0.1 to 3.0 microns. Good resist thickness control is highly desired, and typically variances in thickness should be less than ±10–20 Å across the wafer. Very slight variations in the photoresist material thickness may greatly affect the end result after the photoresist material is exposed by radiation and the exposed portions removed.

Application of the resist onto the wafer is typically accomplished by using a spin coater. The spin coater is essentially a vacuum chuck rotated by a motor. The wafer is vacuum held onto the spin chuck. Typically, a nozzle supplies a predetermined amount of resist to a center area of the wafer. The wafer is then accelerated to and rotated at a certain speed, and centrifugal forces exerted on the resist cause the resist to disperse over the whole surface of the wafer. The resist thickness obtained from a spin coating process is dependent on the viscosity of the resist material, spin speed, the temperature of the resist and temperature of the wafer.

After the resist is spin coated and selectively irradiated to define a predetermined pattern, the irradiated or nonirradiated portions are removed by applying a developer material. The developer material is also spin coated onto the wafer by applying developer material across the resist and then spin coating the developer material until centrifugal forces disperse the developer material over the coating of resist. Due to the surface of the photoresist material layer on the semiconductor being highly hydrophobic, the surface can repel the developer material at the initial state of jetting out the developer material from the developer supply nozzle so that turbulent flow of the developer material is generated on the surface of the resist forming bubbles. The bubbles produced between the photoresist material layer and the developer material are a cause of defects in the resist pattern. A solution to this problem has been to apply a washing solution material or liquid (e.g. water), that is typically used in a rinsing or washing process, onto the photoresist material layer and spin coat the washing solution material to form a washing solution material film. The developer material is then applied to the wafer and the spin coated onto the wafer and the washing solution material film is scattered off the surface of the photoresist material layer leaving only the developer material. After the photoresist material layer has been developed, the irradiated or nonirradiated portions are removed by rinsing or washing with the washing solution material. Each time the washing solution material is applied to the photoresist material layer, a washing solution nozzle is presented above the wafer and the washing solution material is applied. The washing solution nozzle then returns to its rest position and the developer nozzle moves to the center of the photoresist material layer and applies the developer material. The developer nozzle then moves to the rest position and the washing solution nozzle moves above the wafer to rinse the developed portions and the developer material off the photoresist material layer. This constant movement of the different nozzles not only takes up a great deal of time, but eventually leads to mechanical problems and increased maintenance.

A prior art developer nozzle and washing solution application system is illustrated in FIGS. 1a–1b. A multiple tip developer nozzle 10 is coupled to a pivotable arm 12 that pivots from a rest position to an operating position. In the operating position, the multiple tip nozzle 10 applies a developer material 26 on a resist layer 24 disposed on a wafer 22. The wafer 22 is vacuum held onto a rotating chuck 20 driven by a shaft 18 coupled to a motor 16. The developer material flows outward from the center of the photoresist material layer 24 covering the entire top surface of the photoresist material layer 24. A washing solution nozzle 28 is coupled to an arm 32 and moves from an operating position to a rest position. The washing solution nozzle supplies water by providing a washing solution material film prior to applying the developer material, and also providing a rinse to the developed portions and the developer material from the developed photoresist material 24. As illustrated in FIG. 1a, the washing solution nozzle 28 is typically at a much greater distance from the photoresist material layer in its operating state than the developer nozzle is when it is in its operating state resulting in a splashing effect that can result in scattering particles and causing defects. Furthermore, the developer nozzle 28 is specifically designed to apply a uniform layer of developer material, while the washing solution nozzle 28 is typically a water faucet type of arrangement and designed to rinse the developed photoresist off the wafer. Therefore, the washing solution nozzle does not have the advantages associated with the developer nozzle.

A common nozzle for applying both a developer material and a washing solution material has not been employed because the undesirability of the nozzle coming in contact with two completely different materials, which can affect the usefulness of each material. In view of the above, a nozzle is needed, for dispensing not only a uniformly thick layer of developer material across a photoresist material layer formed on a wafer, but also for dispensing a uniformly thick layer of washing solution material on the photoresist material layer, while substantially avoiding any mixing of the two materials with one another. Additionally, there is a need to eliminate the constant movement of the developer nozzle and the washing solution nozzle from the operating position to the rest position.

SUMMARY OF THE INVENTION

The present invention provides a combination nozzle for applying a developer material and a washing solution material at different time intervals to a photoresist material layer disposed on a wafer. The combination nozzle includes a plurality of developer nozzle tips connected to a developer supply line and a plurality of washing solution nozzle tips connected to a washing solution supply line. The developer supply line and the washing solution supply line ensure that the developer material and the washing solution material are substantially isolated from one another. Furthermore, the plurality of developer nozzle tips and the plurality of washing solution nozzle tips are arranged, so that developer material and washing solution material are substantially isolated from one another, so that any intermingling of the materials does not diminish its effectiveness or function. Preferably, the two materials are completely isolated from one another. The volume of the material and the volume flow of the material can be controlled by electronically controlled valves.

One particular aspect of the invention relates to a multiple tip nozzle for applying a material onto a photoresist material layer disposed on a substrate. The nozzle includes a nozzle body and a developer distribution line enclosed in the nozzle body. The developer distribution line is adapted to be connected to a supply of developer material. The nozzle also includes a plurality of developer nozzle tips extending from the nozzle body which are in a communicative relationship with the developer distribution line. A washing solution distribution line enclosed in the nozzle body is also provided. The washing solution distribution line is adapted to be connected to a supply of washing solution material and a plurality of washing solution nozzle tips extend from the nozzle body and are in a communicative relationship with the washing solution distribution line. The developer distribution line and the washing solution distribution line are substantially isolated from one another and the nozzle is adapted to apply onto the photoresist material layer both a developer material and a washing solution material at different time intervals.

Another aspect of the present invention relates to a multiple tip nozzle for applying a material onto a photoresist material layer disposed on a substrate. The nozzle includes a nozzle body, a developer distribution line adapted to be connected to a supply of developer material, a plurality of developer nozzle assemblies extending from the nozzle body and being in a communicative relationship with the developer distribution line, a washing solution distribution line adapted to be connected to a supply of developer material and a plurality of washing solution nozzle assemblies extending from the nozzle body and being in a communicative relationship with the washing solution distribution line. The plurality of developer nozzle tip assemblies and the plurality of washing solution nozzle assemblies are substantially isolated from one another.

Another aspect of the present invention relates to a multiple tip nozzle for applying a material onto a photoresist material layer disposed on a substrate. The nozzle includes means for distributing a developer material to a plurality of developer nozzle tips, means for distributing a washing solution material to a plurality of washing solution nozzle tips and means for substantially isolating the means for distributing the developer material and the means for distributing the washing solution material.

Yet another aspect of the present invention relates to a method for applying a material onto a photoresist material layer disposed on a substrate. The method includes the steps of providing a combination nozzle that supplies both a developer material and a washing solution material, spinning the photoresist material layer on the substrate, moving the combination nozzle to an operating position above the photoresist material layer, applying the developer material until the photoresist material layer is covered by the developer material, stopping the spinning of the substrate until the developer material develops the photoresist material layer, rinsing the wafer with washing solution material, and moving the combination nozzle to a rest position.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 3a illustrates a bottom view of a nozzle with a nozzle arrangement in accordance with the present invention;

FIG. 3a illustrates a side view of the nozzle of FIG. 3a in accordance with the present invention;

FIG. 3b illustrates a side view of the nozzle of FIG. 3a in accordance with the present invention;

FIG. 4a illustrates a bottom view of a nozzle with an alternate nozzle arrangement in accordance with the present invention;

FIG. 4b illustrates a side view of the nozzle of FIG. 4a in accordance with the present invention;

FIG. 5a illustrates a bottom view of a nozzle with another nozzle arrangement in accordance with the present invention;

FIG. 5b illustrates a side view of the nozzle of FIG. 5a in accordance with the present invention;

FIG. 6a illustrates a bottom view of a nozzle with yet another nozzle arrangement in accordance with the present invention;

FIG. 6b illustrates a side view of the nozzle of FIG. 6a in accordance with the present invention;

FIG. 7a illustrates a bottom view of a nozzle with yet another nozzle arrangement in accordance with the present invention;

FIG. 7b illustrates a side view of the nozzle of FIG. 7a in accordance with the present invention;

DETAILED DESCRIPTION OF THE INVENTION

Figure 1:
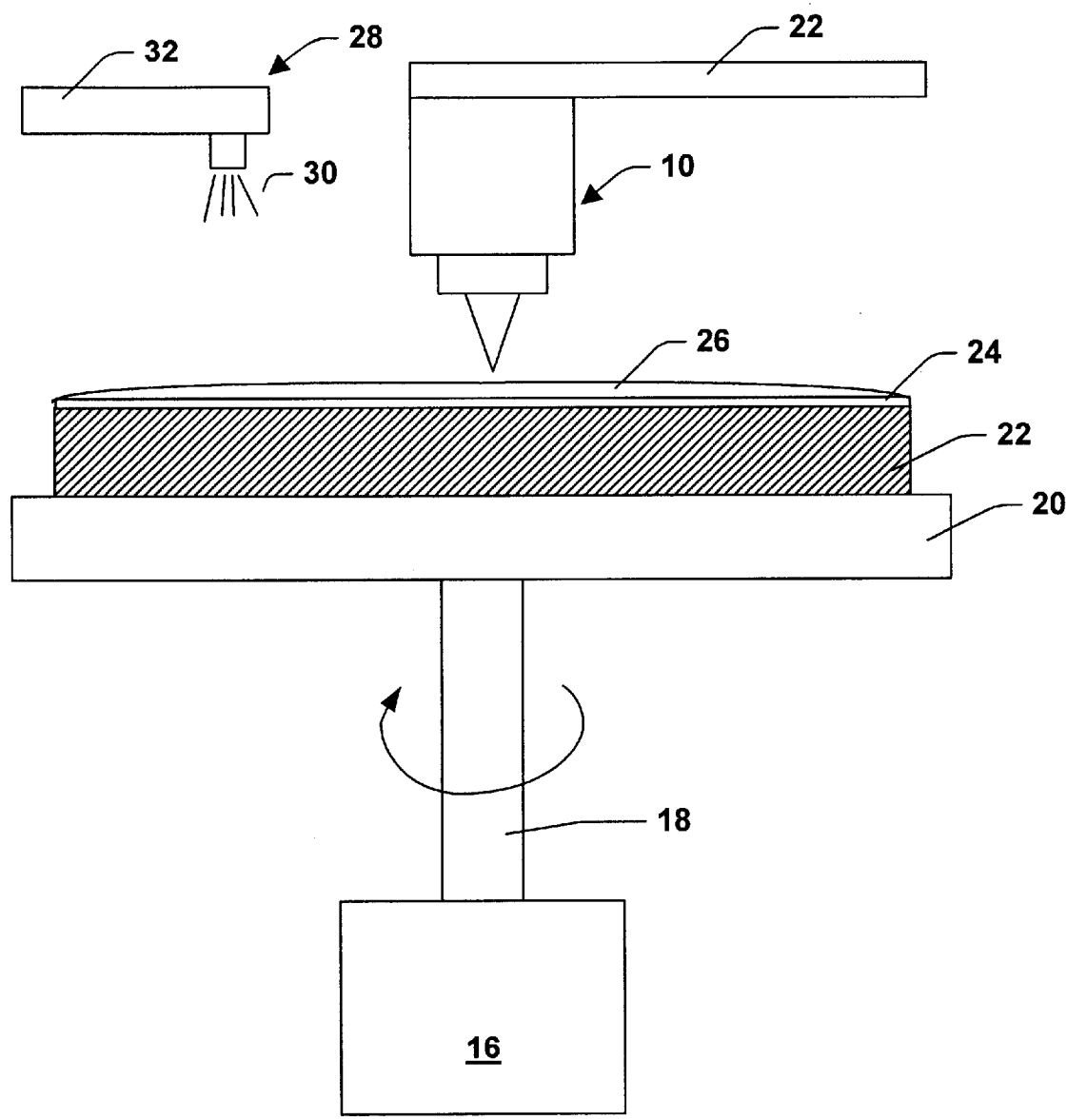
FIG. 1 illustrates a front view of a developer material and washing solution material application system inaccordance with prior art.
Figure 1A:
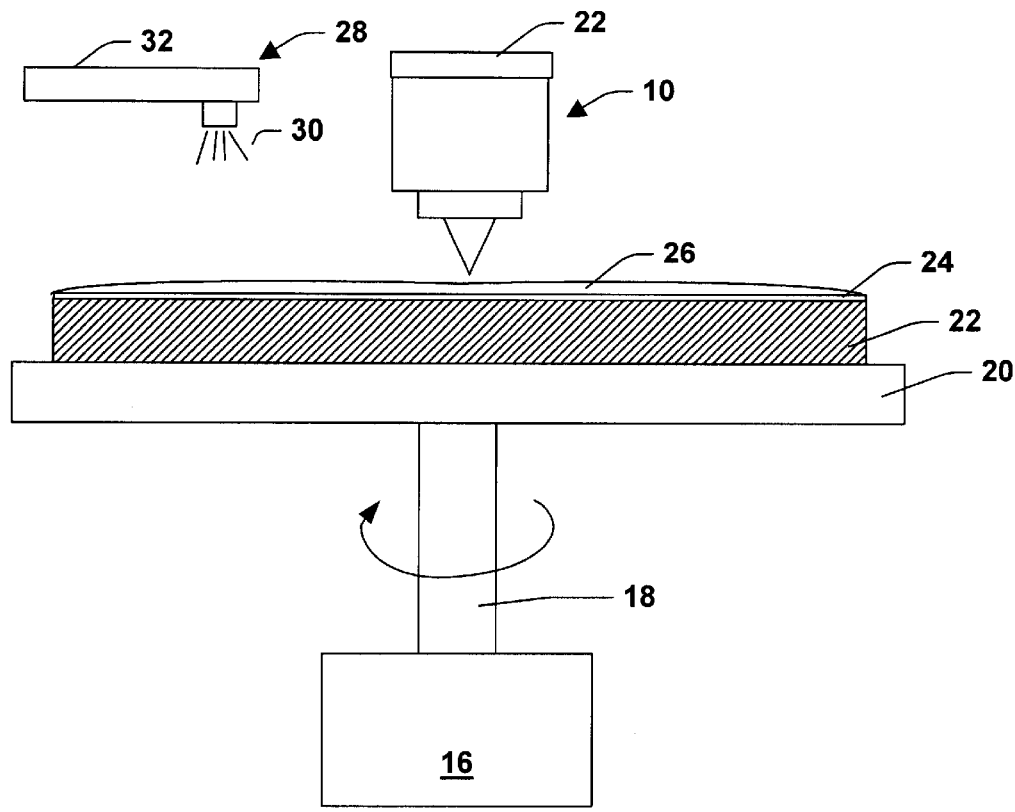
FIG. 1a illustrates a front view of a developer material and washing solution material application system in accordance with the prior art.
Figure 1B:
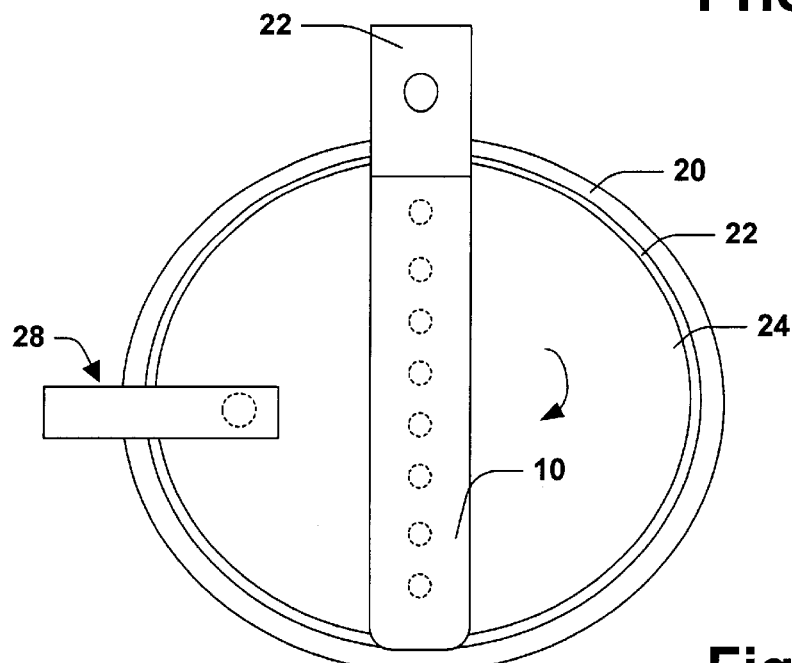
FIG. 1b illustrates a top view of the developer material and washing solution material application system illustrated in FIG. 1a in accordance with the prior art.

The present invention will now be described with reference to the drawings, wherein like reference numerals are used to refer to like elements throughout. The present invention will be described with reference to a nozzle that provides both a supply of developer material and a supply of washing solution material from the same nozzle, while substantially isolating the developer material and the washing solution material from one another. It should be understood that the description of these embodiments are merely illustrative and that they should not be taken in a limiting sense.

Figure 2A:
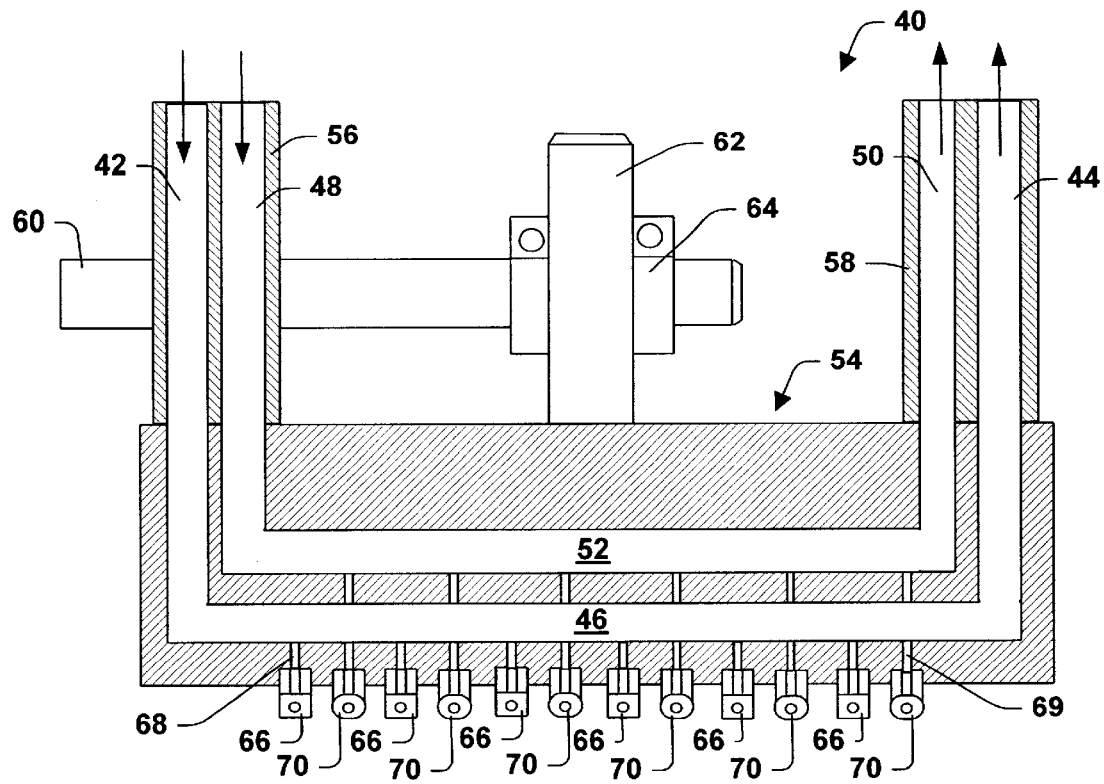
FIG. 2a illustrates a cross-sectional view of an embodiment of a combination nozzle in accordance with the present invention.

Referring initially to FIG. 2a, a multiple tip developer nozzle 40 is provided including a handle 62 connected to an arm 60 by a coupling 64. The nozzle 40 includes a nozzle body 54 with an input supply enclosure 56 and an output supply enclosure 58 extending from the nozzle body 54. A plurality of developer nozzle tips 66 and a plurality of washing solution nozzle tips 70 are connected to the nozzle body 54. A developer input supply tube 42 is connected to a supply of developer material (not shown) on one end and is connected to a developer distribution line 46 on the other end. Each of the developer nozzle tips 66 are connected to the developer distribution line 46 by a developer channel 68. A developer material is provided to the developer distribution line 46 through the developer input supply tube 42 and distributed through the developer nozzle tips 66. The excess developer material exits the nozzle body 54 through a developer output supply tube 44. The developer output supply tube 44 can be connected to a pump, a vacuum or the like for removing excess developer material. A washing solution input supply tube 48 is connected to a supply of washing solution material (not shown) on one end and is connected to a washing solution distribution line 52 on the other end. Each of the washing solution nozzle tips 70 are connected to the washing solution distribution line 52 by a washing solution channel 69. A washing solution material is provided to the washing distribution line 52 through the washing solution input supply tube 48 and distributed through the washing solution nozzle tips 70. The excess washing solution material exits the nozzle body 54 through a washing solution output supply tube 50. The washing solution output supply tube 50 can be connected to a pump, a vacuum or the like for removing excess washing solution material. The nozzle 40 substantially isolates the washing solution material and the developer material from contact with one another.

Figure 2B:
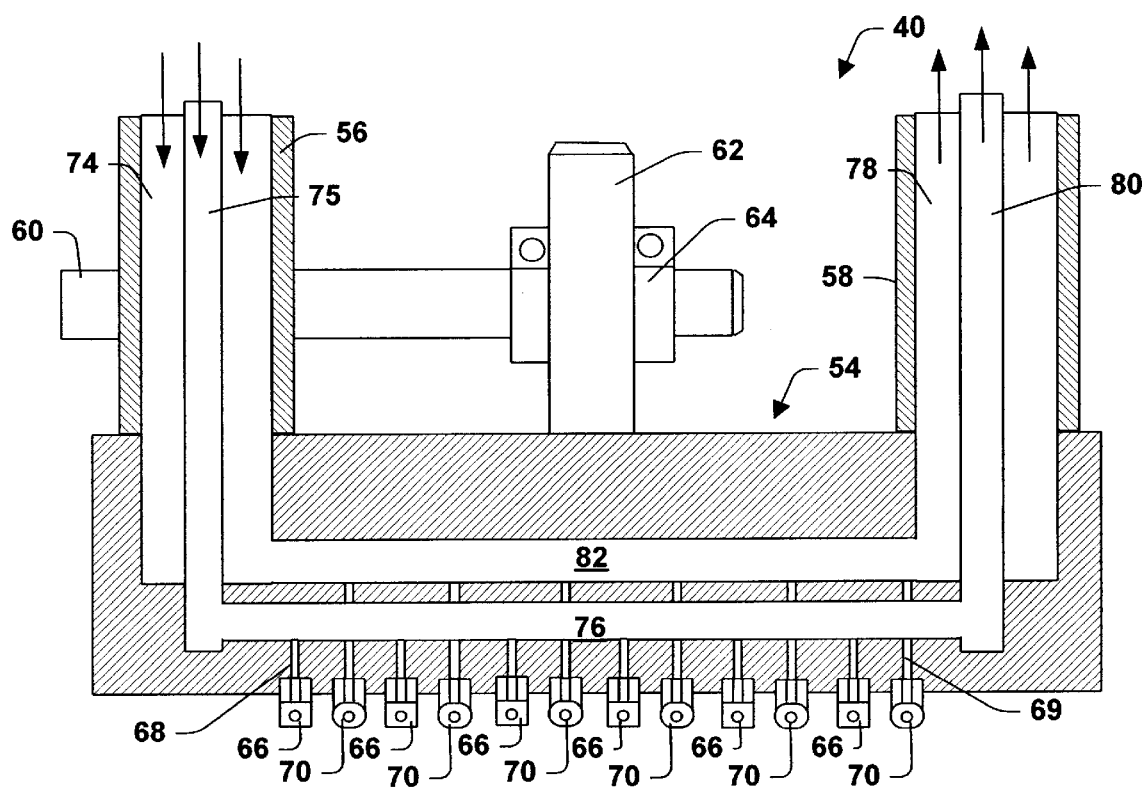
FIG. 2b illustrates a cross-sectional view of an alternate embodiment of a combination nozzle in accordance with the present invention.

An alternate embodiment of the nozzle 40 is illustrated in FIG. 2b. In the alternate embodiment, a developer input supply tube 75 is enclosed by a washing solution input chamber 74. The developer input supply tube 75 extends beyond the washing solution input chamber 74 and is connected to a developer distribution line 76. Each of the developer nozzle tips 66 are connected to the developer distribution line 76 by a developer channel 68. A developer material is provided to the developer distribution line 76 through the developer input supply tube 75 and is distributed through the developer nozzle tips 66. The excess developer material exits the nozzle body 54 through a developer output supply tube 80, which is enclosed by a washing solution output chamber 78. A washing solution distribution line 82 connects the washing solution input chamber 74 to the washing solution output chamber 78. A washing solution material is provided to the washing solution distribution line 82 through the washing solution input chamber 74 and distributed to each washing solution nozzle tip 70 through a washing solution channel 69. The excess washing solution material exits out through the washing solution output supply chamber 78. In the alternate embodiment illustrated in FIG. 2b, the washing solution material flows around the developer tubes 75 and 80, while the developer material flows within the tubes 75 and 80 ensuring that the washing solution material and developer material remain substantially isolated from one another.

FIGS. 3a–3b to FIGS. 7a–7b illustrate particular arrangements of the developer nozzle tips 66 and the washing solution nozzle tips 70 on the nozzle body 54, such that distribution of one material does not come into contact with the nozzle tips of the other material, so that contamination of one material by the other is avoided. Referring initially to FIGS. 3a–3b, the nozzle body 54 includes a bottom surface 84 connected to a side surface 81 by a sloping surface 85. The developer nozzle tips 66 and the washing solution nozzle tips 70 are arranged along a longitudinal length of the sloping surface 85 in an alternating fashion. Dispensing of developer material from the developer nozzle tips 66 and dispensing washing solution material from the washing solution nozzle tips 70 does not cause contact with any of the nozzle tips dispensing the other material.

In another embodiment illustrated in FIGS. 4a–4b, the nozzle body 54 includes the bottom surface 84 and a first sloping surface 86 connected to a second sloping surface 87 which is connected to the side surface 81. The first sloping surface 86 and the second sloping surface 87 form a beveled edge 79. The developer nozzle tips 66 are arranged along a longitudinal length of the first sloping surface 86 and the washing solution nozzle tips 70 are arranged along a longitudinal length of the second sloping surface 87. The developer nozzle tips 66 and the washing solution nozzle tips 70 are arranged in an offset manner from one another, so that dispensing of one material does not come into contact with the nozzle tip of the other material.

In yet another embodiment of the invention as illustrated in FIGS. 5a–5b, the developer nozzle tips 66 are arranged on the bottom surface 84 of the nozzle body 54 along a first longitudinal length of the bottom surface 84. The washing solution nozzle tips 70 are also arranged on the bottom surface 84 of the nozzle body 54 along a second longitudinal length of the bottom surface 84, where the second length is parallel to the first length. In yet another embodiment of the invention illustrated in FIGS. 6a–6b, the developer nozzle tips 66 are arranged along the sloped surface 85 similarly to the arrangement illustrated in FIGS. 3a–3b, except that the washing solution nozzle tips 70 are arranged on the bottom surface 84 of the nozzle body 54 along a longitudinal length of the bottom surface 84.

FIGS. 7a–7b illustrate yet another embodiment of the arrangement of the developer nozzle tips 66 and the washing solution nozzle tips 70. The developer nozzle tips are arranged on the sloped surface 85 similarly to the arrangement illustrated in FIGS. 3a–3b and FIGS. 6a–6b. However, the washing solution nozzle tips 66 are arranged on a sloped surface 88 connecting the bottom surface 84 to a side 83 opposite the side 81. In this type of arrangement, the nozzle 40 may have to be adjusted slightly during application of the washing solution material as opposed to application of the developer material, depending on the location of the nozzle during dispensing.

Figure 8:
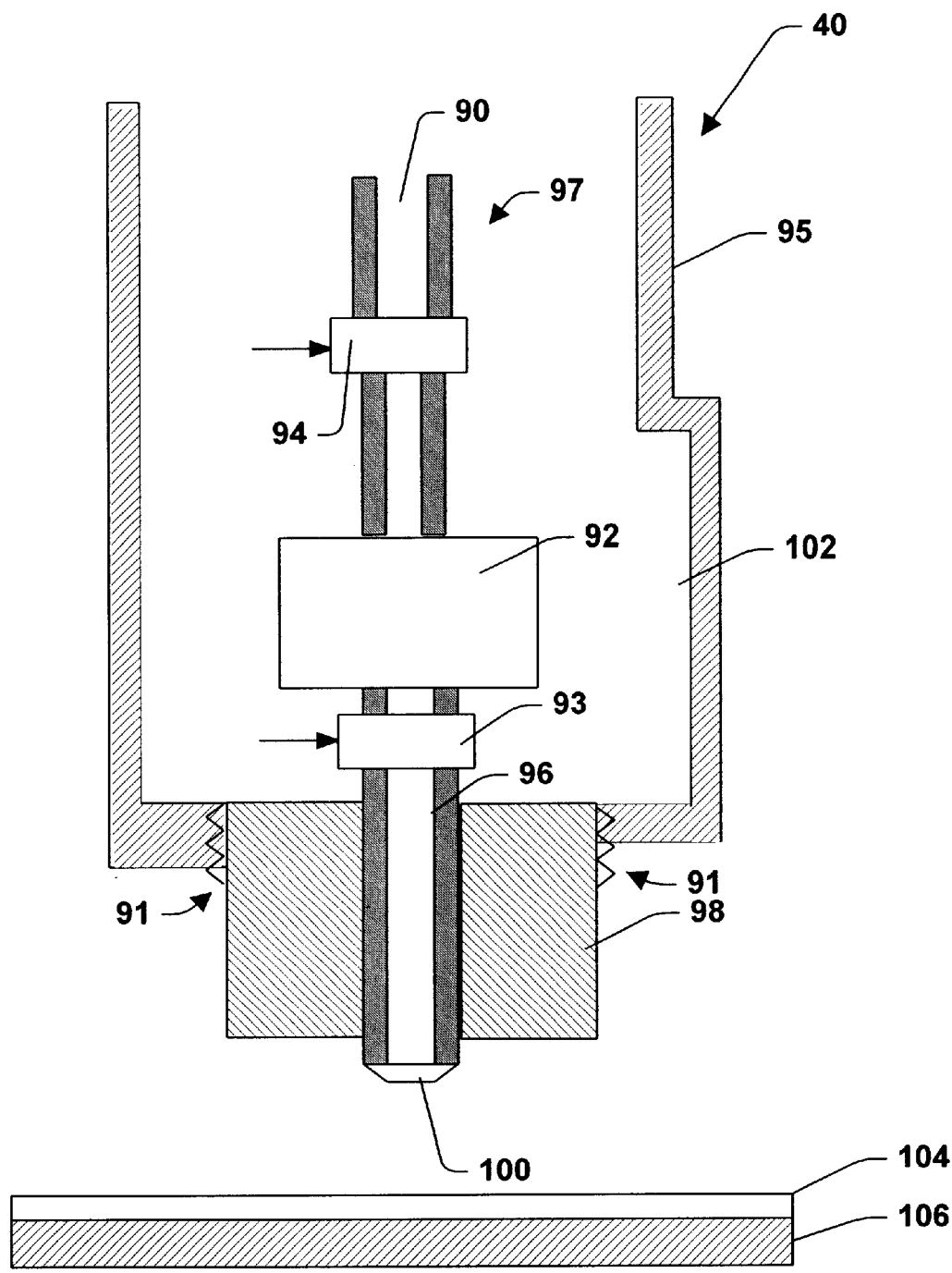
FIG. 8 illustrates a cross-sectional view of a nozzle with nozzle tip assemblies in accordance with the present invention.

FIG. 8 illustrates yet another embodiment of the present invention where control of the volume flow and volume flow rate is provided for each of the nozzle tips. Although the control of the volume flow and the volume flow rate will be explained with reference to distributing the developer material, it is to be appreciated that the same control can be employed for distributing the washing solution material. The nozzle 40 includes a holder 95 defining a chamber 102 that holds a plurality of nozzle tips assemblies 97. Each nozzle tip assembly 97 includes a developer supply tube 90 with one end disposed in the holder 95 and the other end connected to a supply of developer material (not shown). A volume control valve 94 controls the volume of developer received into a receiving chamber 92 from the developer supply tube 90. A collar 98 is connected to the bottom of the holder 95 and includes a central aperture for allowing a development supply barrel 96 to pass therethrough. The collar 98 threadingly engages the holder 95 via threads 91 on both the collar 98 and the holder 95. Supply barrel 96 is connected to the receiving chamber 92 on one end and passes through the center of collar 98. The supply barrel 96 includes a liquid discharge opening 100 that discharges the developer material to a photoresist material layer 104 disposed on a substrate 106. A volume of developer material is received in the receiving chamber 92 depending on the setting of the volume control valve 94. The chamber 92 and the tip 100 cooperate to deposit developer material at a controlled flow rate onto the photoresist material layer 104. A second control valve 93 can be placed between the receiving chamber 92 and the liquid discharge opening 100 for selectively controlling the developer material flow rate from the receiving chamber to the photoresist material layer 104. In an alternate embodiment, a first volume control valve supplies the developer supply line 46 or 76 with the developer material and a second volume control valve supplies the washing solution material to the washing solution supply line 52 or 82. These first and second volume control valves can also be used to control the volume flow of the developer material and the washing solution material, respectively.

Figure 9:
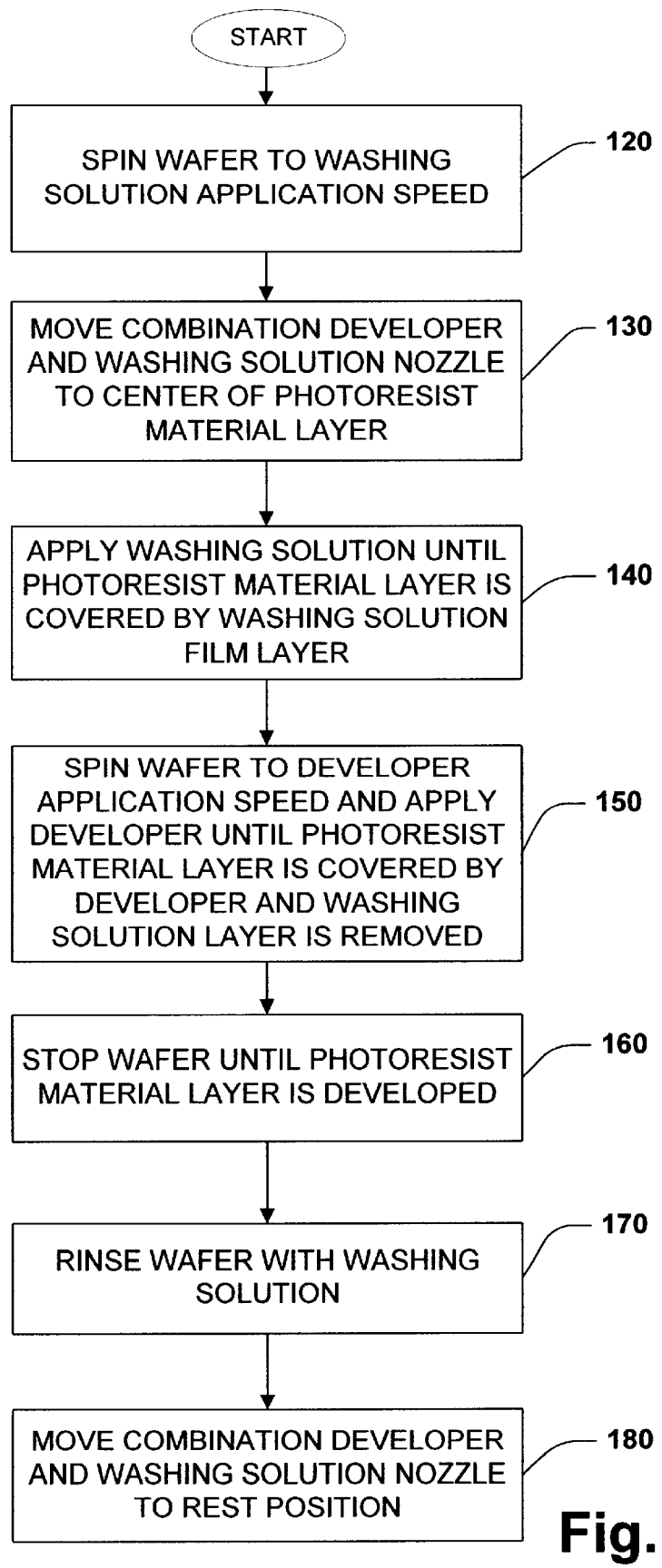
FIG. 9 is a flow diagram illustrating one specific methodology for carrying out the present invention.

FIG. 9 is a flow diagram illustrating one particular methodology for carrying out the present invention. In step 120, a wafer is spun to a washing solution material application speed. In step 130, a combination developer material and washing solution material material nozzle is moved to the center of a photoresist material layer disposed on the wafer. In step 140, a washing solution material is applied until the photoresist material layer is covered with a film layer of washing solution material. The wafer is then spun to a developer material application speed and a developer material is applied until a developer material layer covers the photoresist material layer and the washing solution material is removed in step 150. In step 160, the wafer is stopped until the photoresist material layer is developed. In step 170, the wafer is rinsed with the washing solution material. The combination developer material and washing solution nozzle is then moved to its rest position in step 180. The process can then be repeated for the next wafer.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A multiple tip nozzle for applying a material onto a photoresist material layer disposed on a substrate, the nozzle comprising:

a nozzle body;

a developer distribution line enclosed in the nozzle body, the developer distribution line being adapted to be connected to a supply of developer material on a first end and a removal device on a second end wherein developer material is provided to the developer distribution line from the supply of developer material and excess developer material is removed by the removal device;

a plurality of developer nozzle tips extending from the nozzle body and being in a communicative relationship with the developer distribution line;

a washing solution distribution line enclosed in the nozzle body, the washing solution distribution line being adapted to be connected to a supply of washing solution material on a first end and a removal device on a second end wherein the washing solution is provided to the washing distribution line from the supply of washing solution material and excess washing solution material is removed by the removal device;

a plurality of washing solution nozzle tips extending from the nozzle body and being in a communicative relationship with the washing solution distribution line, wherein the developer distribution line and the washing solution distribution line are substantially isolated from one another and the nozzle is adapted to apply onto the photoresist material layer both a developer material and a washing solution material at different time intervals;

a developer input supply tube connected at a first end to the developer distribution line and adapted to be connected to a second end by the supply of developer material; and a washing solution input supply chamber connected at a first end to the washing distribution line and adapted to be connected to a second end by the supply of washing solution material, the washing solution input supply chamber substantially surrounding at least a portion of the developer input supply tube.

2. The nozzle of claim 1, the washing solution input supply tube and the developer input supply tube running in different substantially isolated paths.

3. The nozzle of claim 2, further including a developer output supply tube connected at a first end to the developer distribution line and adapted to be connected to a removing device at a second end for removing excess developer material from the developer distribution line.

4. The nozzle of claim 3, further including a washing material output supply tube connected at a first end to the washing solution distribution line and adapted to be connected at a second end to a removing device for removing excess washing solution material from the washing solution distribution line, the washing solution output supply tube and the developer input supply tube running in different substantially isolated paths.

5. The nozzle of claim 1, further including a developer output supply tube connected at a first end to the developer distribution line and adapted to be connected to a removing device at a second end for removing excess developer material from the developer distribution line.

6. The nozzle of claim 5, further including a washing material output supply chamber connected at a first end to the washing solution distribution line and adapted to be connected at a second end to a removing device for removing excess washing solution material from the washing solution distribution line, the washing solution output supply chamber substantially surrounding at least a portion of the developer output supply tube.

7. The nozzle of claim 1, wherein the nozzle body includes a bottom surface connected to a side surface by a sloping surface, the plurality of developer nozzle tips and the plurality of washing solution nozzle tips being arranged along a longitudinal length of the sloping surface in an alternating fashion.

8. The nozzle of claim 1, wherein the nozzle body includes a bottom surface connected to a first sloping surface that is connected to a second sloping surface, the second sloping surface is connected to a side surface, the plurality of developer nozzle tips being arranged along a longitudinal length of the first sloping surface and the plurality of washing solution nozzle tips being arranged along a longitudinal length of the second sloping surface, such that the plurality of developer nozzle tips are offset from the plurality of washing solution nozzle tips.

9. The nozzle of claim 1, wherein the nozzle body includes a bottom surface, the plurality of developer nozzle tips being arranged along a first longitudinal length of the bottom surface and the plurality of washing solution nozzle tips being arranged along a second longitudinal length of the bottom surface.

10. The nozzle of claim 1, wherein the nozzle body includes a bottom surface connected to a side surface by a sloping surface, the plurality of developer nozzle tips being arranged along a longitudinal length of the bottom surface and the plurality of washing solution nozzle tips being arranged along a longitudinal length of the sloping surface.

11. The nozzle of claim 1, wherein the nozzle body includes a bottom surface connected to a first sloping surface that is connected to a first side surface, the bottom surface also being connected to a second sloping surface connected to a second side surface being located on the opposite side of the first side surface, the plurality of developer nozzle tips being arranged along a longitudinal length of the first sloping surface and the plurality of washing solution nozzle tips being arranged along a longitudinal length of the second sloping surface.

12. A multiple tip nozzle for applying a material onto a photoresist material layer disposed on a substrate, the nozzle comprising:

a nozzle body;

a developer distribution line extending through the nozzle body along a first path;

a plurality of developer nozzle assemblies extending along an outside surface of the nozzle body and being in a communicative relationship with the developer distribution line;

a developer input supply tube connected at a first end to the developer distribution line and adapted to be connected a supply of developer material at a second end;

a washing solution distribution line extending through the nozzle body along a second path, the second path being substantially isolated from the first path;

a plurality of washing solution nozzle assemblies extending along an outside surface of the nozzle body and being in a communicative relationship with the washing solution distribution line, wherein of the plurality of developer nozzle tip assemblies and the washing solution nozzle assemblies are substantially isolated from one another; and a washing solution input supply chamber connected at a first end to the washing distribution line and adapted to be connected to a supply of washing solution material at a second end, the washing solution input supply chamber substantially surrounding at least a portion of the developer input supply tube.

13. The nozzle of claim 12, further including an electronic control valve adapted to control one of a volume of material and a volume flow of material to one of the developer distribution line and the washing solution distribution line.

14. The nozzle of claim 12, wherein at least one of plurality of developer nozzle assemblies and the plurality of washing solution nozzle assemblies includes an electronic control valve for controlling one of a volume of material and a volume flow of material.

15. The nozzle of claim 14, wherein each of the plurality of developer nozzle assemblies and the plurality of washing solution nozzle assemblies include an electronic control valve for controlling one of a volume of material and a volume flow of material.

16. The nozzle of claim 15, wherein each of the plurality of developer nozzle assemblies and the plurality of washing solution nozzle assemblies include an electronic control valve for controlling the volume of material and an electronic control valve for controlling the volume flow of material.

17. A multiple tip nozzle for applying a material onto a photoresist material layer disposed on a substrate, the nozzle comprising:

means for distributing a developer material to a plurality of developer nozzle tips, the means for distributing a developer material having a developer input supply tube;

means for distributing a washing solution material to a plurality of washing solution nozzle tips, the means for distributing a washing solution material having a washing solution input supply chamber substantially surrounding at least a portion of the developer input supply tube;

means for isolating the means for distributing the developer material and the means for distributing the washing solution material;

means for allowing removal of excess developer material from the nozzle; and means for allowing removal of excess washing solution material from the nozzle.

* * * * *